July 14, 1959

H. HECHT 2,894,491

FAIL-SAFE SERVOMECHANISM SYSTEM AND AMPLIFIER ARRANGEMENTS THEREFOR

Filed Feb. 14, 1955

INVENTOR
HERBERT HECHT
BY R. J. Craddock
ATTORNEY

United States Patent Office 2,894,491

Patented July 14, 1959

2,894,491

FAIL-SAFE SERVOMECHANISM SYSTEM AND AMPLIFIER ARRANGEMENTS THEREFOR

Herbert Hecht, Wantagh, N.Y., assignor to Sperry Rand Corporation, a corporation of Delaware Application February 14, 1955, Serial No. 487,998

5 Claims. (Cl. 121—41)

Figures 1, 2, 3:
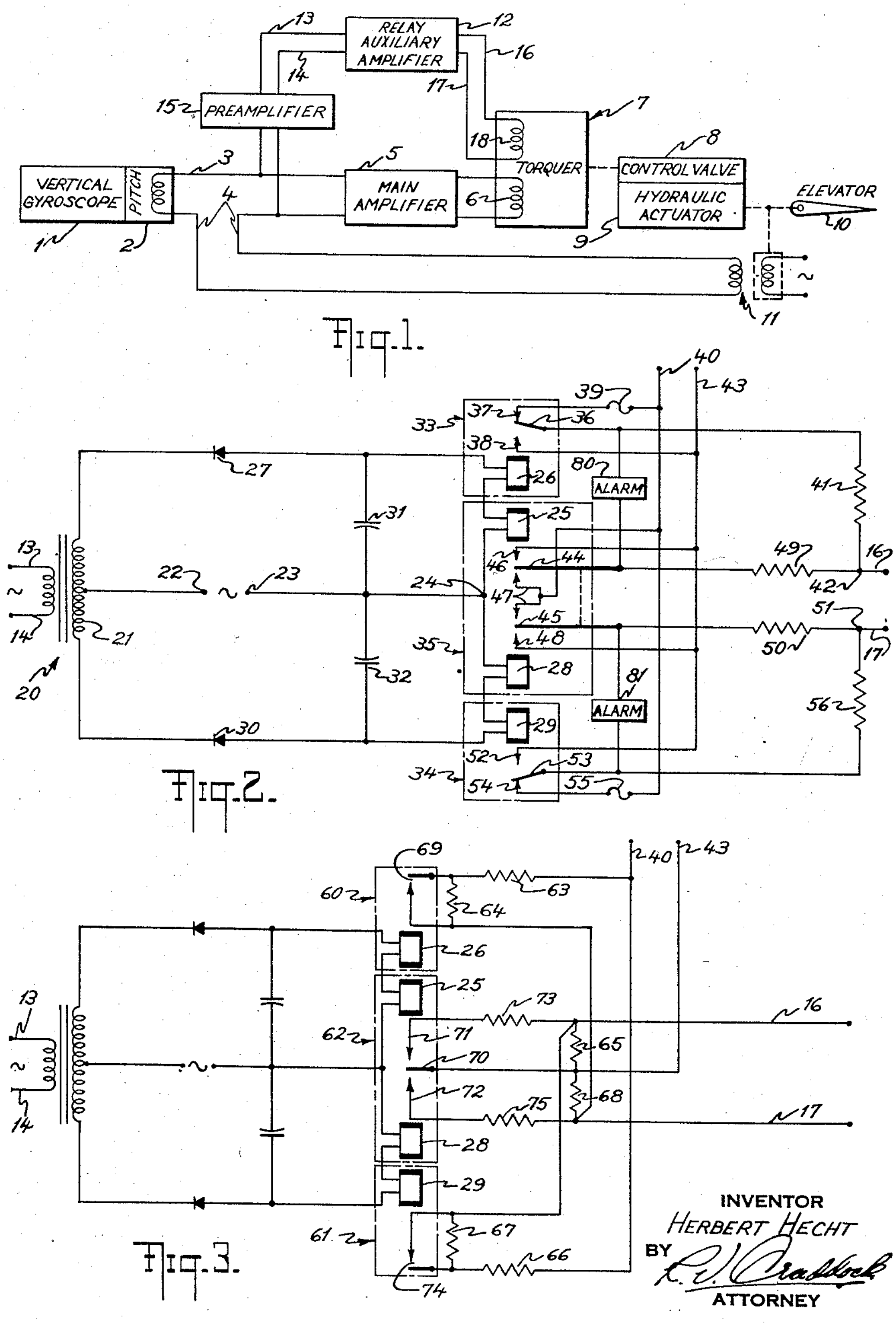

This invention relates to servomechanism systems, and particularly to a system of this category that remains operative in a proper sense notwithstanding the occurrence of malfunctions therein. In another of its aspects, the invention concerns novel fail-safe electromechanical amplifier arrangements for inclusion in the foregoing system.

The system of the present invention employs a follow-up loop including a main amplifier for amplifying the algebraic sum of condition error signals and position repeatback signals in a substantially linear manner before they are fed in controlling relation to servomotor apparatus for positioning an object to reduce the condition error to zero. The signal input to the main amplifier also forms the signal input to an electromechanical amplifier connected to control the servomotor apparatus, but the electromechanical amplifier provides an output only when the input thereto exceeds a predetermined value near the level at which limiting output is obtained from the main amplifier. The electromechanical amplifier imparts added energy to the servomotor apparatus thus extending the linear operating range of the system. Also, in case of a malfunction, the output of the electromechanical amplifier takes over control of the servomotor apparatus from the main amplifier.

The fail-safe electromechanical amplifier arrangements of the present invention are uniquely well-suited to serve in the role of auxiliary amplifier in the foregoing system. Each of the fail-safe electromechanical amplifiers is of the non-linear type employing a plurality of relay devices controlled by the amplifier input signals to switch selected portions of power from a power source to the load formed by the servomotor apparatus of the system. The respective pluralities of relay devices and their associated circuitry are so arranged that a wide variety of malfunctions may occur therein without detrimental effect on the system. Moreover, through the use of such relay devices, a high figure of merit is realized for the fail-safe or electromechanical amplifier arrangements where this criterion is based on power output per unit of weight.

An object of the present invention is to provide an improved and highly reliable servomechanism system that remains operative in a proper sense notwithstanding the occurrence of malfunctions therein.

Another object is to provide an improved non-linear fail-safe electromechanical amplifier arrangement that employs a plurality of relay devices controlled by an input to said arrangement for switching selected portions of power from a power source to a load.

With the foregoing and other objects in view, the present invention includes the novel elements and the combinations and arrangements thereof described below and illustrated in the accompanying drawings, in which Fig. 1 is a block diagram of the elevator control channel of an aircraft automatic pilot embodying the present invention; and Figs. 2 and 3 are schematic representations of non-linear fail-safe electromechanical amplifier arrangements, each of which may serve as the auxiliary amplifier depicted in Fig. 1.

In the aircraft automatic pilot system of Fig. 1, a vertical gyroscope 1 is provided with a rotary transformer type of pick-off 2 on its pitch axis for supplying an alternating current signal both proportional to departures of the craft from a given pitch attitude and also reversible in phase according to the vertical direction of such departures. The pitch signal thus obtained, together with a position repeatback signal to be described, is fed via a pair of leads 3, 4 to an amplifier 5, the output of which is supplied to a winding 6 of an electromagnetic torquer 7 coupled to a control valve 8 for controlling the operation of a hydraulic actuator 9. Actuator 9 is connected to an elevator control surface 10 for positioning the same. A connection is also made from actuator 9 to the rotor of a rotary transformer type of signal generator 11 so that an alternating current signal of variable magnitude and reversible phase is produced across the stator of generator 11 according to the position of elevator 10 relative to a reference or streamlined position therefor. The elevator position signal thus obtained is inserted into lead 4 in a degenerative sense with respect to the pitch signal, thereby to provide the aforesaid position repeatback for the system.

As long as the automatic pilot system is operating normally, the net signal input to amplifier 5 (i.e., the difference between the pitch signal and the repeatback signal) remains less than a predetermined magnitude. In the case of very large attitude changes, or in the case of malfunction, however, the input to amplifier 5 will exceed this predetermined magnitude.

For example, a failure of amplifier 5 causes a complete failure of the elevator positioning system, resulting in a loss of repeatback signal to buck out the pitch signal from gyroscope pick-off 2. Thus, with nothing to check its magnitude, the signal input to amplifier 5 may readily increase beyond its normal bounds.

Another example of a malfunction manifested by an abnormally large input to amplifier 5 is a failure of actuator 9 to respond according to the output of amplifier 5. A malfunction of this nature may arise from a stickiness of control valve 8 due, for instance, to a metallic chip in the actuating fluid or from the opening of winding 6 in torquer 7. Hence, the repeatback output of generator 11 may remain at the magnitude obtaining upon the occurrence of the response failure of actuator 9, while the pitch output of pick-off 2 continues to vary with the attitude of the craft. Thus, the repeatback signal may become considerably larger than the magnitude required to buck out the pitch signal or may become considerably smaller. In either event, the net signal input to amplifier 5 will again increase beyond its normal bounds.

According to the present invention, a fail-safe arrangement is provided for preventing malfunctions of the foregoing type from causing a loss of automatic control of the aircraft, and, indeed, to prevent the placing of the craft in a sustained pitch attitude other than substantially the given attitude from which gyroscope 1 senses craft departures. In carrying out the invention, an electromechanical amplifier 12 of the electromagnetic relay type receives its input from a pair of leads 13, 14 connected across input leads 3, 4 of amplifier 5 via a preamplifier 15, and supplies its output on a pair of leads 16, 17 connected across a winding 18 of torquer 7, this winding being duplicate to winding 6 thereof. Relay amplifier 12 responds to produce an output when the signal fed to its input exceeds a certain value. The gain of preamplifier 15 is such that this value is produced in the input of relay amplifier 12 when the input of amplifier 5 reaches its normal peak magnitude. Thus, relay amplifier 12 responds when the input of amplifier 5 exceeds said magnitude, hence responds when a system malfunction occurs.

If the system malfunction is a failure of amplifier 5 and/or an open circuit in torquer winding 6, relay amplifier 12 and torquer winding 18 serve as a substitute amplifier and torquer winding, respectively, for operating control valve 8 in the proper sense. And if the malfunction results from the sticking of control valve 8, relay amplifier 12, by its energization of torquer winding 18, supplies an actuating torque to control valve 8 additional to that supplied by torquer winding 6, whereby to tend to overcome the stickiness and free the control valve.

In order to provide an exceptionally high order of reliability, both preamplifier 15 and relay amplifier 12 are themselves constructed in a manner to make failure unlikely. To this end, preamplifier 15 is preferably of a redundant type such as, for example, a push-pull amplifier. Thus, failure of half of preamplifier 15 may occur without rendering the same inoperative to a detrimental extent. As for relay amplifier 12, this apparatus may take at least two fail-safe forms which are respectively illustrated in Figs. 2 and 3.

Referring to Fig. 2, the signal voltage on leads 13, 14, having been amplified by preamplifier 15 (Fig. 1) is fed to the primary winding of a transformer 20 having a mid-tapped secondary winding 21. One terminal 22 of a source of alternating voltage of the same frequency as the signal voltage and of a slightly higher peak amplitude is connected to the mid-tap of winding 21, while the other source terminal 23 is connected to a junction terminal 24. From terminal 24, a series connection of two relay coils 25, 26 and a rectifier element 27 is made to one end terminal of secondary winding 21, and another series connection of two relay coils 28, 29 and a rectifier element 30 is made to the other end terminal of winding 21. Rectifier element 27 is poled with respect to its direct connection to winding 21 identically to rectifier element 30 with respect to its direct connection to winding 21. Moreover, a smoothing capacitor 31 is connected across coils 25, 26 and a like capacitor 32 is connected across coils 28, 29. By this arrangement, the relay coils are connected in the output of a half-wave phase-sensitive demodulator, whereby unidirectional currents are simultaneously caused to flow in coils 25, 26 and coils 28, 29 on alternate half cycles of the signal input on leads 13, 14. Depending on the phase of the signal input relative to the voltage introduced at terminals 22, 23, the current flowing through one set of coils will substantially exceed the current flowing through the other set. In fact, while the smaller current will never be sufficient to actuate the switching elements of the coils through which it flows, the larger current may be sufficient to actuate at least one of the switching elements of the coils through which it flows, as will be more particularly described hereinafter.

Coil 26, forming part of a relay 33, controls a single-pole double-throw relay switching element having a movable contact 36, a fixed upper contact 37, and a fixed lower contact 38. Contact 37 is connected through a fuse wire 39 to a lead 40 which is connected to one side of an alternating current power source. Contact 36 is connected through an impedance element or resistor 41 to a terminal 42 on input lead 16 of control valve torquer 7 (Fig. 1); and contact 38 is connected to a lead 43 which is connected to the other side of the power source. In the unactuated state of relay 33, contact 36 bears against contact 37, thereby to connect power lead 40 to torquer lead 16. And in the actuated state of relay 33, contact 36 is moved away from contact 37 to bear against contact 38, thereby to open the previous connection and connect the other power lead 43 to torquer lead 16.

As earlier noted, coil 25 is energized by the same current as coil 26 of relay 33 just described. Coil 25 constitutes one of the actuating coils of a differential relay 35 and controls a double-pole double-throw switching element having an upper movable contact 44 which is movable simultaneously with a lower movable contact 45. In the unactuated state of relay 35, contact 44 resides between a fixed contact 46 which is connected directly to power lead 43 and a fixed double contact 47 which is connected directly to power lead 40, while contact 45 resides between double contact 47 and a fixed contact 48 which is connected directly to power lead 43, neither contact 44 nor contact 45 touching any of the fixed contacts. Contact 44 is connected through an impedance element or resistor 49 to terminal 42 on torquer lead 16, and contact 45 is connected through an impedance element or resistor 50 to a terminal 51 on torquer lead 17.

When coil 25 of relay 35 is energized sufficiently for actuation, contacts 44 and 45 are caused to bear against contacts 46 and 47, respectively. In this event, a resistance path from power lead 43 to torquer lead 16 is provided in parallel with the resistance path supplied between these leads by the actuation of relay 33. Similarly, a resistance path from power lead 40 to torquer lead 17 is provided in parallel with a resistance path provided between these leads via the switching element of a relay 34 controlled by coil 29 and now to be described.

Relay 34 is substantially identical to relay 33. Its switching element comprises a fixed upper contact 52, a movable contact 53, and a fixed lower contact 54. Contact 52, as are contacts 46, 48 of relay 35 and contact 38 of relay 33, is connected directly to power lead 43. Contact 54 is connected through a fuse wire 55 to power lead 40; and contact 53 is connected through an impedance element or resistor 56 to terminal 51 on torquer lead 17. With relay 34 unactuated, contact 53 bears against contact 54, thereby to provide the aforementioned resistance path from power lead 40 to torquer lead 17. When relay 34 is actuated, however, contact 53 bears against contact 52, thereby to break the connection of resistor 56 and torquer lead 17 from power lead 40 and substitute a connection of the resistor and torquer lead to power lead 43.

Coil 28 constitutes the remaining actuating coil of differential relay 35; and, as earlier noted, it is energized by the same current as coil 29 of relay 34, just described. When energized sufficiently for actuation, coil 28 causes contacts 44 and 45 to bear against double contact 47 and contact 48, respectively. This operation provides a resistance path from power lead 40 to torquer lead 16 in parallel with the resistance path supplied between these leads by the switching element of unactuated relay 33. Similarly, a resistance path from power lead 43 to torquer lead 17 is provided in parallel with the resistance path provided between these leads by the actuation of relay 34.

By the relay amplifier arrangement depicted in Fig. 2, an alternating voltage derived from power leads 40, 43 is connected through one pair of parallel impedance or resistance paths to torquer leads 16, 17 in one phase sense by the actuation of relay 35 by coil 25 and the actuation of relay 33 by coil 26 and is connected through another pair of parallel paths to leads 16, 17 in a reversed phase sense by the actuation of relay 35 by coil 28 and the actuation of relay 34 by coil 29. Thus, the phase of the voltage across torquer leads 16, 17, hence the direction in which elevator 10 (Fig. 1) is positioned, depends on the phase of the input signal voltage across leads 13, 14, since the latter phase is determinative of which relays are actuated. If D.-C. power is supplied to power leads 40, 43 instead of A.-C. power as described, it will be apparent that the polarity of the voltage across torquer leads 16, 17 depends on the phase of the input signal voltage across leads 13, 14. Hence, the terms "polarity" and "phase," insofar as they are employed to describe the power inputs to auxiliary amplifier 12 (Fig. 1), are used interchangeably.

Instead of relays 33, 34, 35 all having like threshold values of actuating current, whereby, for example, relay 35 would close contacts 44, 46 and 45, 47 simultaneously with the closing of contacts 36, 38 by relay 33, it is preferable to select like threshold actuating currents for relays 33, 34, only, such currents having a value less than the threshold value for relay 35. By this arrangement, a large input signal or a malfunction in main amplifier 5 (Fig. 1) will first operate one of relays 33, 34, thereby to provide one resistance path from power lead 40 to torquer lead 16 and one resistance path from power lead 43 to torquer lead 17, or vice versa, depending on the phase of the error signal input on leads 13, 14. The actuation of one of relays 33, 34 may be sufficient to torque control valve 8 (Fig. 1) rapidly enough for positioning elevator 10 (Fig. 1) so that the relay coil current, hence the error signal input, will be prevented from reaching the threshold value required to actuate differential relay 35. On the other hand, if control valve 8 is not torqued rapidly enough, relay 35 is actuated to reduce the net resistance in the circuit of torquer winding 18 (Fig. 1), thereby to increase the rate at which elevator 10 is positioned. Hence, when operating normally, the relay amplifier of Fig. 2 provides two-speed bi-directional positional control of elevator 10.

When not operating normally, i.e., when stricken with a malfunction itself, the relay amplifier of Fig. 2 nevertheless remains in a condition to effectively take over from a malfunctioning main amplifier 5 (Fig. 1) or to provide the added torque needed to free a sticky control valve 8 (Fig. 1). Malfunctions that may occur in the relay amplifier include open coil circuits, sticking contacts, and failure of movable contacts to make contact in either direction of their movement.

Assuming, for illustrative purposes, that resistors 41, 56 (Fig. 2) are each equal to 0.2 of the resistance of torquer winding 18 (load resistance) and resistors 49, 50 are each equal to 0.25 of such load resistance, then the following tabulation of percentages of power voltage (from leads 40, 43) that appears across torquer leads 16, 17 may be made for different relay amplifier malfunctions as noted below:

*Table I*

| Malfunction | Percentage of Power Voltage Placed Across Torquer Winding 18 | | | | |
|---|---|---|---|---|---|
| | At Threshold Coil Current of— | | At Less Then Threshold Coil Currents of Relays 33, 34 (Stop) | At Threshold Coil Current of— | |
| | Relay 35, Coil 25 (Full Up) | Relay 33 (Part Up) | | Relay 34 (Part Down) | Relay 35, Coil 28 (Full Down) |
| None | 82 | 72 | 0 | 72 | 82 |
| Open circuit for coil 26, or sticking of contacts 36, 37. | 36 | 0 | 0 | 72 | 82 |
| Sticking of contacts 36, 38 | 82 | 72 | 0 | 0 | 36 |
| Failure of contact 36 to make on either of contacts 37, 38. | 74 | 0 | 0 | 0 | 74 |
| Open circuit for coil 29, or sticking of contacts 53, 54. | 82 | 72 | 0 | 0 | 36 |
| Sticking of contacts 52, 53 | 36 | 0 | 0 | 72 | 82 |
| Failure of contact 53 to make on either of contacts 52, 54. | 74 | 0 | 0 | 0 | 74 |
| Sticking of contacts 44, 47 and 45, 48 | 8.3 | 8.3 | 36% down | 82 | 82 |
| Sticking of contacts 44, 46 and 45, 47 | 82 | 82 | 36% up | 8.3 | 8.3 |
| Open circuit for coil 25 | 72 | 72 | 0 | 72 | 82 |
| Open circuit for coil 28 | 82 | 72 | 0 | 72 | 72 |
| Failure of contacts 44, 45 to make respectively on either contacts 46, 47 or 47, 48. | 72 | 72 | 0 | 72 | 72 |

From the foregoing illustrative tabulation, it will be seen that the relay amplifier of Fig. 2, without a malfunction therein, will energize torquer winding 18 (Fig. 1) in the proper sense with 72% of the voltage on power leads 40, 43 when the error signal input received through preamplifier 15 (Fig. 1) is sufficient to actuate one of the S.P.D.T. relays 33, 34 but is insufficient to cause actuation of differential relay 35, and with 82% of the power voltage when the input is sufficient to actuate relay 35.

It will further be evident that for any one of the tabulated malfunctions or their equivalents, the relay amplifier of Fig. 2 will produce an output of proper phase or polarity in the presence of an error signal sufficient to actuate at least one of the relays, although this output in some instances is less than normal and sometimes must await an error signal build-up sufficient to actuate relay 35. With two exceptions, no output is produced for an error signal providing less than the threshold coil currents of relays 33, 34 (malfunction absent in main channel of Fig. 1). In both cases where such output occurs (sticking contacts in relay 35), the effect on the main channel is equivalent to a slight change in the reference pitch attitude defined by gyroscope 1 (Fig. 1). In no case, therefore, is elevator 10 driven to a hard-over position due to a malfunction in the relay amplifier of Fig. 2; but, instead, the elevator is positioned at different rates, depending on the malfunction, and in the proper sense to maintain the aircraft at the reference pitch attitude or slightly removed therefrom.

An alarm arrangement may be readily provided for the relay amplifier of Fig. 2 so that the occurrence of a malfunction therein may quickly come to the attention of the pilot of the aircraft. Accordingly, an electrically-operated alarm device 80 of a visual or aural type is connected across movable contacts 36 and 44, and a like alarm device 81 is connected across movable contacts 45 and 53. The common impedance of alarm devices 80, 81 is large with respect to both the resistors 41, 56 and the resistors 49, 50 so that the impedance between contact 36 and terminal 42, as well as the impedance between contact 53 and terminal 51, is practically the impedance of resistors 41, 56. Hence, for all practical purposes, the addition of the alarm devices does nothing to alter the operation of the relay amplifier of Fig. 2 as thus far described.

The presence of the alarm devices in the relay amplifier of Fig. 2 does, however, provide notice of all the malfunctions noted in Table I except for an open circuit for coil 25 or coil 28 and for a failure of contacts 44, 45 to make respectively on either contacts 46, 47 or 47, 48.

The threshold operating current for alarm 80, for example, is slightly less than the current that flows through alarm 80 when relay 35 is actuated and contact 36 fails to make on either of contacts 37, 38. In this particular instance, alarm 81 is short-circuited to place across power terminals 40, 43 a parallel combination of resistor 50 with resistor 56 in series with the load (torquer winding 18 of Fig. 1) and another parallel combination having resistor 49 in one arm and resistor 41 and alarm 80 in a second arm. On the other hand, the threshold operating current for alarm 80, hence alarm 81, is greater than the minute current that flows through alarm 80 when relay 33 or relay 34 is actuated in the absence of a malfunction in the relay amplifier.

Threshold current also flows through alarm 80 when no relays are actuated and contacts 44, 47 and contacts 45, 48 are stuck, but this changes to maximum current when relay 33 is actuated thereby to place both alarm 80 and alarm 81 directly across power terminals 40, 43. It will be noted that maximum current also flows through alarm 80 when relays 34 and 35 are both actuated and contacts 36, 38 of relay 33 are stuck, and when relay 35 is actuated and coil 26 is open-circuited.

Currents equal to those that flow through alarm device 80 for the malfunctions noted for relay 33 and half of relay 35 flow also through alarm 81 for corresponding malfunctions for relay 34 and the other half of relay 35. By this arrangement, an alarm is sounded or flashed by at least one of the alarm devices 80, 81 whenever the relay amplifier of Fig. 2 is prevented from performing normally by any one of a given number of possible malfunctions.

An alternative form of relay amplifier 12 (Fig. 1) is illustrated in Fig. 3. This circuit employs fewer contacts than the circuit of Fig. 2, yet affords a comparable measure of fail-safe operation.

In Fig. 3, coils 26, 29 and 25, 28 are again employed together with the phase-sensitive demodulating arrangement of Fig. 2 for energizing the same, but coils 26, 29 now respectively constitute the actuating coils of single-pole single-throw relays 60, 61 and coils 25, 28 now respectively constitute the actuating coils of a single-pole differential relay 62. The switching elements of the relays are actuated to unbalance a normally balanced resistance bridge having one diagonal thereof connected across power leads 40, 43 and the other diagonal connected across torquer leads 16, 17.

The arm of the bridge connecting torquer lead 17 to power lead 40 is made up of a resistor 63 connected in series with a resistor 64, while the arm connecting torquer lead 17 to power lead 43 is made up of a resistor 68. Further, the arm connecting torquer lead 16 to power lead 40 is made up of a resistor 66 connected in series with a resistor 67, while the arm connecting torquer lead 16 to power lead 43 is made up of a resistor 65. Resistors 63, 66 are of equal impedance values, as are resistors 64, 67 and 65, 68.

When coil 26 of relay 60 is energized by an actuating current, it closes a pair of normally open contacts 69 connected across resistor 64, thereby short-circuiting the latter from its arm of the bridge. Thus the bridge is unbalanced a given amount, resulting in an output voltage across torquer leads 16, 17 of proper phase or polarity relative to the input voltage on leads 13, 14 and of a preselected fixed magnitude. If the actuating current of coil 26 reaches or exceeds the threshold current for relay 62, then coil 25 of the latter causes a movable contact 70, normally residing between but not contacting an upper fixed contact 71 and a lower fixed contact 72, to bear against said fixed contact 71, thereby to connect a resistor 73 across resistor 65 to further unbalance the bridge, resulting in a greater fixed voltage across torquer leads 16, 17 of the same phase or polarity produced by the actuation of relay 60.

When the phase of the input on leads 13, 14 reverses, and the coil current is sufficient to actuate relay 61, coil 29 thereof closes a pair of normally open contacts 74 connected across resistor 67, thereby short-circuiting the latter from its arm of the bridge. Thus the bridge is unbalanced to produce a fixed output voltage of phase or polarity opposite to that produced by actuation of relay 60. A further unbalance of the bridge, resulting in a greater fixed output voltage having this phase or polarity, is brought about by the actuation of relay 62 by coil 28 in response to the current therein reaching or exceeding the threshold magnitude for the relay. Coil 28 causes movable contact 70 to bear against fixed contact 72, thereby to connect a resistor 75 equal to resistor 73 across resistor 68, resulting in the requisite further unbalance.

The form of relay amplifier depicted in Fig. 3, therefore, produces no output for inputs falling below the threshold magnitude for relays 60 and 61, but does produce an output of one magnitude for inputs ranging from the threshold magnitude of relays 60 and 61 to the threshold magnitude of relay 62 and an output of a greater magnitude for inputs exceeding the threshold magnitude of relay 62, the phase or polarity of the outputs depending on the phase of the inputs. In this regard, the relay amplifier of Fig. 3, although differing in circuitry from the relay amplifier of Fig. 2, nevertheless has the same general response characteristics.

Besides being responsive in the same general fashion as the relay amplifier of Fig. 2, the relay amplifier of Fig. 3 is also inherently fail-safe for any one malfunction therein except the sticking of contact 70 to one of the contacts 71, 72. However, even this malfunction may be rendered nugatory by observing the following relation in selecting values for the different resistors:

$$\frac{R_1(R_3+R_4)}{R_3R_4} < \frac{R_1+R_2}{R_4}$$

where $R_1$=common value of impedance of resistors 63, 66.
$R_2$=common value of impedance of resistors 64, 67.
$R_3$=common value of impedance of resistors 73, 75.
$R_4$=common value of impedance of resistors 65, 68.

Assuming for illustrative purposes in Fig. 3 that the impedance of each resistor except resistors 64, 67 is 0.3 of the load impedance formed by torquer winding 18, and that the impedance of each of resistors 64, 67 is 0.5 of such load impedance, then the following tabulation of percentages of power voltage (from leads 40, 43) that appears across torquer leads 16, 17 may be made for different relay amplifier malfunctions as noted below:

*Table II*

| Malfunction | Percentage of Power Voltage Placed Across Torquer Winding 18 | | | | |
|---|---|---|---|---|---|
| | At Threshold Coil Current of— | | At Less Then Threshold Coil Currents of Relays 60, 61 (Stop) | At Threshold Coil Current of— | |
| | Relay 62, Coil 25 (Full Up) | Relay 60 (Part Up) | | Relay 61 (Part Down) | Relay 62, Coil 28 (Full Down) |
| None | 25.5 | 15.3 | 0 | 15.3 | 25.5 |
| Open circuit for coil 26 | 8.6 | 0 | 0 | 15.3 | 25.5 |
| Sticking of contacts 69 | 25.5 | 15.3 | 15.3% up | 0 | 13.0 |
| Open circuit for coil 29 | 25.5 | 15.3 | 0 | 0 | 8.6 |
| Sticking of contacts 74 | 13.0 | 0 | 15.3% down | 15.3 | 25.5 |
| Open circuit for coil 25 | 15.3 | 15.3 | 0 | 15.3 | 25.5 |
| Open circuit for coil 28 | 25.5 | 15.3 | 0 | 15.3 | 15.3 |
| Sticking of contacts 70, 71 | 25.5 | 25.5 | 8.6% up | 3.5 | 13.3 |
| Sticking of contacts 70, 72 | 13.3 | 3.5 | 8.6% down | 25.5 | 25.5 |

From the foregoing illustrative tabulation, it will be seen that the relay amplifier of Fig. 3, without a malfunction therein, will energize torquer winding 18 (Fig. 1) in the proper sense with 15.3% of the voltage on power leads 40, 43 when the error signal input received through peramplifier 15 (Fig. 1) is sufficient to actuate one of the S.P.S.T. relay 60, 61 but is insufficient to cause actuation of differential relay 62, and with 25.5% of the power voltage when the input is sufficient to actuate relay 62.

It will further be evident that for any one of the tabulated malfunctions or their equivalents, the relay amplifier of Fig. 3 will produce an output of proper phase or polarity in the presence of an error signal sufficient to actuate at least one of the relays, although this output in some instances is less than normal and sometimes must await an error signal build-up sufficient to actuate relay 62. Where an output is produced for an error signal providing less than the threshold coil currents of relays 60, 61 (malfunction absent in main channel of Fig. 1), the effect on the main channel is equivalent to a slight change in the reference pitch attitude defined by gyroscope 1 (Fig. 1). In no case, therefore, is elevator 10 driven to a hard-over position due to a malfunction in the relay amplifier of Fig. 3; but, instead, the elevator is positioned at different rates, depending on the malfunction, and in the proper sense to maintain the aircraft at the reference pitch attitude or slightly removed therefrom.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What is claimed is:

1. An autopilot system for controlling the attitude of an aircraft by a control surface positioning servomechanism energized from the output of a linear amplifier the signal input of which represents the difference between attitude error and control surface position signals of reversible phase, said system including an electromechanical amplifier having its input connected to receive said linear amplifier input, said electromechanical amplifier providing an output dependent in phase on the phase of its input and of one fixed magnitude for an input falling within a first range of magnitudes and of a larger fixed magnitude for an input exceeding the maximum value of said first range of magnitudes, there being no output from said electromechanical amplifier for values of said input less than the minimum value of said first range of magnitudes, said input normally remaining within a second range of magnitudes the maximum value of which is less than the minimum value of said first range of magnitudes, and means for energizing said servomechanism in accordance with the output of said electromechanical amplifier, whereby a system malfunction causing said input to increase beyond its normal or second range of magnitudes results in auxiliary energization of said servomechanism by said electromechanical amplifier in one of two amounts dependent upon the extent of said increase.

2. An autopilot system of the character claimed in claim 1, in which said electromechanical amplifier comprises a pair of output terminals, a pair of power terminals, first means actuable for providing a first connection between said power terminals and said output terminals in one polarity sense, said first connection including a given impedance, second means actuable for providing a second connection between said power terminals and said output terminals in an opposite polarity sense, said second connection including an impedance equal to said given impedance, third means actuable to reduce the impedance of said first connection, fourth means actuable to reduce the impedance of said second connection, means responsive to an input in excess of a first predetermined magnitude for actuating said first and second means, respectively, when said first input is of one phase and of a reversed phase, and means responsive to an input in excess of a second predetermined magnitude larger than said first magnitude for actuating said third and fourth means, respectively, when said input is of said one phase and of said reversed phase.

3. An autopilot system of the character claimed in claim 1, in which said electromechanical amplifier comprises first and second A.C. power terminals, first and second output terminals, a first resistor connecting said first power terminal to said first output terminal, a second resistor connecting said first power terminal to said second output terminal, first means responsive to an input signal of a given phase and in excess of a first predetermined magnitude for disconnecting said first resistor from said first power terminal and connecting the same to said second power terminal, second means responsive to an input signal of phase opposite to said given phase and in excess of said first predetermined magnitude for disconnecting said second resistor from said first power terminal and connecting the same to said second power terminal, a third resistor having one side thereof connected to said first output terminal, a fourth resistor having one side thereof connected to said second output terminal, third means operable in a first sense to connect the other sides of said third resistor and said fourth resistor respectively to said second power terminal and said first power terminal, said third means being operable in a second sense to reverse said connections to said power terminals, and means for operating said third means in said first sense thereof when said input signal is of said given phase and in excess of a second predetermined magnitude larger than said first predetermined magnitude and in said second sense when said input signal is of said opposite phase and in excess of said second predetermined magnitude.

4. An autopilot system of the character claimed in claim 1, in which said electromechanical amplifier comprises first and second A.C. power terminals, first and second output terminals, first and second equal resistors connecting said first power terminal respectively to said first and second output terminals, first means responsive to an input signal of a given phase and in excess of a first predetermined magnitude for disconnecting said first resistor from said first power terminal and connecting the same to said second power terminal, second means responsive to an input signal of phase opposite to said given phase and in excess of said first predetermined magnitude for disconnecting said second resistor from said second power terminal and connecting the same to said second power terminal, a third resistor having one side thereof connected to said first output terminal, a first electrically-operated alarm device connected across said first power terminal and the other side of said third resistor, a fourth resistor equl to said third resistor and having one side thereof connected to said second output terminal, a second electrically-operated alarm device connected across said first power terminal and the other side of said fourth resistor, third means operable in a first sense to connect said other sides of said third and fourth resistors respectively to said second power terminal and said first power terminal, said third means being operable in a second sense to reverse said connections to said power terminals, and means for operating said third means in said first sense thereof when said input signal is of said given phase and in excess of a second predetermined magnitude larger than said first predetermined magnitude and in said second sense when said input signal is of said opposite phase and in excess of said second predetermined magnitude, whereby upon operation of said third means, said alarm devices are short-circuited to place said first resistor in parallel with said third resistor across said output terminal and one of said power terminals, and to place said second resistor in parallel with said fourth resistor across said second output terminal and the other of said power terminals.

5. An autopilot system of the character claimed in claim 1, in which said electromechanical amplifier comprises first and second power terminals, first and second output terminals, an impedance bridge having equal first and second impedance arms connected from said first power terminal respectively to said first and second output terminals and having equal third and fourth impedance arms connected from said second power terminal respectively to said first and second output terminals, first switching means actuable to short-circuit a preselected portion of the impedance of said first arm, second switching means actuable to short-circuit an equivalent preselected portion of impedance of said second arm, a pair of equal impedances, third switching means actuable to connect one of said impedance pair across said fourth arm, fourth switching means actuable to connect the other of said impedance pair across said third arm, means for actuating said first switching means when said input signals exceed a first predetermined magnitude and are of a given phase, means for actuating said second switching means when said input signals exceed said first magnitude and are of a phase opposite to said given phase, means for actuating said third switching means when said input signals exceed a second predetermined magnitude greater than said first magnitude and are of said given phase, and means for actuating said fourth switching means when said input signals exceed said second magnitude and are of said opposite phase.

References Cited in the file of this patent

UNITED STATES PATENTS

| | | |
|---|---|---|
| 2,260,160 | Benning et al. | Oct. 21, 1941 |
| 2,307,904 | Wheelock | Jan. 12, 1943 |
| 2,646,469 | Long | July 21, 1953 |
| 2,649,841 | Jacques | Aug. 25, 1953 |
| 2,672,334 | Chenery | Mar. 16, 1954 |
| 2,781,743 | Mann et al. | Feb. 19, 1957 |